(12) United States Patent
Kuriyama

(10) Patent No.: US 6,285,262 B1
(45) Date of Patent: Sep. 4, 2001

(54) FREQUENCY DIVIDER, A PHASE LOCK OSCILLATOR AND A FLIP-FLOP CIRCUIT USING THE FREQUENCY DIVIDER

(75) Inventor: Yasuhiko Kuriyama, Yokohama (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 09/340,709

(22) Filed: Jun. 29, 1999

(30) Foreign Application Priority Data

Jun. 30, 1998 (JP) .................................................. 10-199547

(51) Int. Cl.$^7$ .................................................... H03K 23/00
(52) U.S. Cl. .............................. 331/25; 331/57; 331/1 A; 377/47; 327/156; 327/115; 327/117
(58) Field of Search ................................ 331/25, 57, 1 A; 377/49, 47; 327/156, 117, 115

(56) References Cited

FOREIGN PATENT DOCUMENTS

| 61-134122 | 6/1986 | (JP) . |
|---|---|---|
| 5-291944 | 11/1993 | (JP) . |
| 9-246957 | 9/1997 | (JP) . |

*Primary Examiner*—Arnold Kinkead
(74) *Attorney, Agent, or Firm*—Oblon, Spivak, McClelland, Maier & Neustadt, P.C.

(57) ABSTRACT

A frequency divider comprises first and second basic gates. Each basic gate includes first and second differential circuits, an adder unit for adding outputs from the first and second differential circuits and a buffer circuit to which an output from the adder unit is input. In the frequency divider, the adder units of the first and second basic gates receive negative feedback respectively from the adder units of the first and second basic gates and the second differential circuits through the buffer circuits of the first and second basic gates. An output from the adder unit of the first basic gate is connected to an input of the first differential circuit of the second basic gate, and an output from the adder unit of the second basic gate is fed back to an input of the first differential circuit of the first basic gate. The frequency divider further comprises a first current source for supplying a current in common to the first differential circuits of the first and second basic gates, a first current switching circuit inserted between the first current source and the first differential circuits of the first and second basic gates, and second and third current sources for respectively supplying currents to the second differential circuits of the first and second basic gates. A differential input signal is input to the first current switching circuit and a frequency-divided output signal is obtained from the buffer circuit of the second basic gate.

19 Claims, 12 Drawing Sheets

FREQUENCY DIVIDER, A PHASE LOCK OSCILLATOR AND A FLIP-FLOP CIRCUIT USING THE FREQUENCY DIVIDER

BACKGROUND OF THE INVENTION

The present invention relates to a frequency divider, and particularly to a dynamic frequency divider comprising differential circuits. The present invention also relates to a phase lock oscillator using such a frequency divider. Further, the present invention relates to a flip-flop circuit obtained by improving the frequency divider.

A dynamic frequency divider, using differential circuits, is known as a frequency divider suitable for a high-speed operation. FIG. 1 shows a conventional dynamic frequency divider, wherein a ring oscillator structure is made of two basic gates, each having a pair of emitter-coupled differential transistors, which constitute a differential circuit, and an emitter follower which receives outputs from the collectors of the transistors.

More specifically, a basic gate 1 of a first stage (first basic gate 1) comprises a first pair of emitter-coupled differential transistors Q1 and Q2, to which resistors R1 and R2 serving as collector loads are connected, and an emitter follower comprised of transistors Q3 and Q4 which receive collector outputs of the transistors Q1 and Q2. Similarly, a basic gate 2 of a second stage (second basic gate 2) comprises a second pair of emitter-coupled differential transistors Q5 and Q6, to which resistors R3 and R4 serving as collector loads are connected, and an emitter follower comprised of transistors Q7 and Q8 which receive collector outputs of the transistors Q5 and Q6.

Emitter outputs of the transistors Q7 and Q8 constituting the emitter follower of the second basic gate 2 are fed back to the bases of the emitter-coupled differential transistors Q1 and Q2 of the first basic gate 1, so that the phase of a signal is inverted in one cycle.

The common emitter of the emitter-coupled differential transistors Q1 and Q2 of the first stage and the common emitter of the emitter-coupled differential transistors Q5 and Q6 are respectively connected to the collectors of a third pair of emitter-coupled differential transistors Q9 and Q10. The common emitter of the emitter-coupled differential transistors Q9 and Q10 is connected to a current source CS1. The emitters of the transistors Q3, Q4, Q7 and Q8 constituting the emitter followers are individually connected to current sources CS3, CS4, CS7 and CS8.

Differential input signals CK and /CK are input to the bases of the third pair of emitter-coupled differential transistors Q9 and Q10. Frequency-divided output signals are obtained from outputs OUT and /OUT of the emitter follower (emitter outputs of the transistors Q7 and Q8) of the second basic gate 2.

FIG. 2 shows a characteristic of an input signal power sensitivity with respect to a division frequency (a frequency of an input signal to be divided) in the conventional dynamic frequency divider. Unlike the normal frequency divider, the dynamic frequency divider performs self-excited oscillation at a specific frequency, i.e., free-running frequency $f_{freerun}$, even if an input signal power is not input. As shown in FIG. 2, the input signal power sensitivity is high at the free-running frequency $f_{freerun}$. At the other frequencies, a high input signal power is required. In other words, the input signal power sensitivity is low in a frequency range other than the free-running frequency.

Therefore, to extend the range of the use frequency of the frequency divider, it is effective to vary the free-running frequency. For this reason, the conventional art employs a method of varying the free-running frequency by changing the current value of the current source CS1 shown in FIG. 1. According to this method, however, the amplitude of an output signal is changed depending on the current value of the current source CS1. In other words, the method is disadvantageous in that the amplitude of an output signal is changed depending on the division frequency. Thus, the method is not suitable for practical use.

Moreover, the maximum division frequency of the conventional dynamic frequency divider is $\frac{1}{2} \tau d$, which is substantially determined by a delay time $\tau d$ per basic gate. Therefore, to increase the maximum division frequency, i.e., to realize a high-speed operation, it is important to reduce the delay time $\tau d$. The delay time $\tau d$ is the sum of the minimum switching time of the pair of emitter-coupled differential transistors and the delay time of the emitter follower in one basic gate. Since these values are substantially determined by the performance of the transistors, reduction in the delay time $\tau d$ is inevitably limited.

As described above, the conventional dynamic frequency divider has the following drawbacks. First, if the free-running frequency is varied to extend the range of the use frequency, the amplitude of an output signal is changed depending on the frequency. Secondly, reduction in the delay time is limited, since the maximum division frequency is substantially determined by a delay time per basic gate, and the delay time is the sum of the switching time of the pair of emitter-coupled differential transistors and the delay time of the emitter follower in the basic gate and determined by the performance of the transistors.

BRIEF SUMMARY OF THE INVENTION

A main object of the present invention is to provide a frequency divider in which the free-running frequency is varied without a considerable change in the amplitude of an output signal to extend the range of use frequency, and the signal delay time per basic gate is shortened to make a high-speed operation possible.

Another object of the present invention is to provide a frequency divider in which the signal delay time is further reduced to make the operation speed higher and the efficiency of utilizing the power source voltage is increased.

According to a first aspect of the present invention, there is provided a frequency divider comprising:

first and second basic gates, each including first and second differential circuits, an adder unit for adding outputs from the first and second differential circuits and a buffer circuit to which an output from the adder unit is input, wherein the adder units of the first and second basic gates receive negative feedback from outputs from the adder units of the first and second basic gates by the second differential circuits of the first and second basic gates through the buffer circuits of the first and second basic gates, an output from the adder unit of the first basic gate is connected to an input of the first differential circuit of the second basic gate, and an output from the adder unit of the second basic gate is fed back to an input of the first differential circuit of the first basic gate;

a first current source for supplying a current in common to the first differential circuits of the first and second basic gates;

a first current switching circuit inserted between the first current source and the first differential circuits of the first and second basic gates; and second and third current sources for respectively supplying currents to the second differential circuits of the first and second basic gates, wherein a differential input signal is input to the first current switching circuit and a frequency-divided output signal is obtained from the buffer circuit of the second basic gate.

In the frequency divider thus constructed, the free-running frequency of the frequency divider is considerably changed by controlling the current (average current $I_1$) supplied from the common current source through the current switching circuit to the first differential circuits of the first and second basic gates and the current ($I_2=I_3=I_4$) supplied from the second and third current sources to the second differential circuits of the first and second basic gates. In this case, if the average of the squares of the values of the currents $I_1$ and $I_2$ is kept constant, an output signal amplitude can be kept constant.

Further, when the current I2 is increased, the amount of negative feedback from the output of the emitter follower, i.e., a buffer circuit, is increased. Thus, since the delay timer per basic gate can be smaller than the sum of the delay times of the differential circuits and the emitter followers. Therefore, the maximum division frequency can be considerably increased. As a result, the range of the use frequency can be extended by changing the free-running frequency, while the amplitude of an output signal is not considerably changed. In addition, the delay time per basic gate can be reduced, so that a high-speed operation can be performed.

Furthermore, outputs of adder means (common collector outputs of the emitter-coupled differential transistor pairs) are output from the first basic gate, and directly input to the first differential circuit of the second basic gate, not through a buffer circuit (emitter follower). Therefore, since the delay time of the buffer circuit of the first basic gate is not included in the signal transmission time, the operation speed can be accordingly higher than in the case where an output from the buffer circuit of the first basic gate is input to the second basic gate.

Moreover, since the buffer circuit of the first basic gate is connected to the first differential circuit and the current switching circuit of the second basic gate, the efficiency of utilizing the power source voltage is improved. In other words, as compared to the conventional art, the same output signal amplitude can be obtained at a lower power source voltage, or the output amplitude can be greater at the same power source voltage.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described with reference to the accompanying drawings.

First Embodiment

Figure 3:
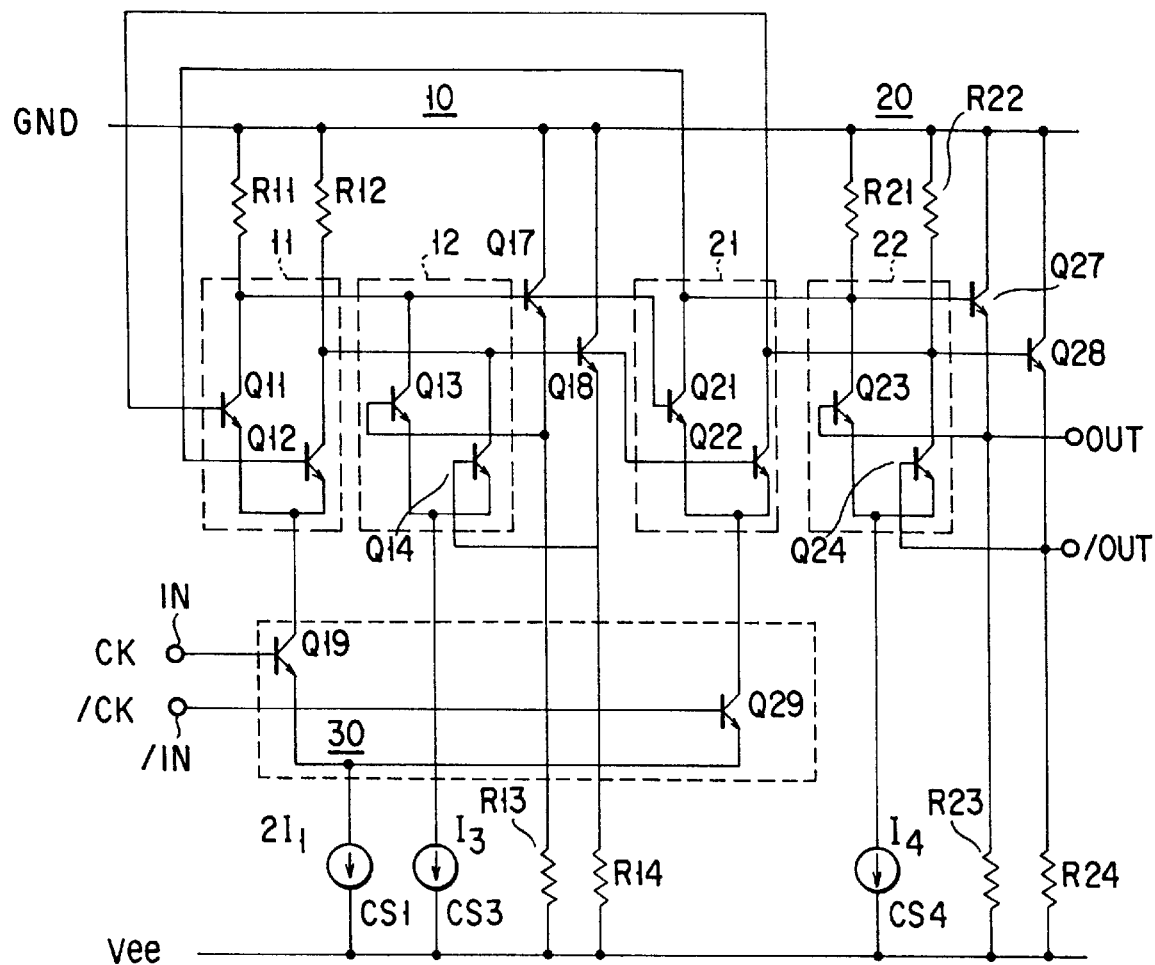
FIG. 3 is a circuit diagram of a frequency divider according to a first embodiment of the present invention.

FIG. 3 is a circuit diagram showing a frequency divider according to a first embodiment of the present invention. This frequency divider is a dynamic frequency divider having two basic gates 10 and 20, which constitutes a ring oscillator as a whole. The basic gates 10 and 20 have the following structures.

The first basic gate 10 mainly comprises first and second differential circuits 11 and 12 connected to common loads, and first and second emitter followers forming a buffer circuit. More specifically, the first and second differential circuits 11 and 12 respectively comprise a first pair of emitter-coupled differential transistors Q11 and Q12 and a second pair of emitter-coupled differential transistors Q13 and Q14. The collectors of the transistors Q11 and Q13 are connected to a high-potential power source terminal (in this embodiment, a ground GND) through a common load resistor R11. The collectors of the transistors Q12 and Q14 are connected to the ground GND through a common load transistor R12.

The transistors Q17 and Q18 respectively constitute first and second emitter followers together with resistors R13 and R14 connected as loads between the emitters of the respective transistors and the power source Vee. The bases of the second pair of emitter-coupled differential transistors Q13 and Q14 (i.e., inputs of the second differential circuit 12) receive negative feedback from outputs of the emitter followers (i.e., outputs of the emitters of the transistors Q17 and Q18).

In the same manner as in the first basic gate 10, the second basic gate 20 comprises first and second differential circuits 21 and 22 connected to common collector loads R21 and R22, and first and second emitter followers. The first and second differential circuits 21 and 22 respectively comprise a first pair of emitter-coupled differential transistors Q21 and Q22 and a second pair of emitter-coupled differential transistors Q23 and Q24. Transistors Q27 and Q28 respectively constitute the first and second emitter followers together with resistors R23 and R24.

Outputs of the first basic gate 10 are outputs from the common collector of the transistors Q11 and Q13 and the common collector of the transistors Q12 and Q14. The outputs are connected to the bases of the first pair of differential transistors Q21 and Q22 of the second basic gate 20. Outputs of the second basic gate 20 are outputs from the first and second emitter followers (the emitters of the transistors Q27 and Q28). The outputs are respectively connected to a pair of output terminals OUT and /OUT.

The common collector of the transistors Q21 and Q23 and the common collector of the transistors Q22 and Q24 of the second basic gate 20 are respectively connected to the bases of the pair of emitter-coupled differential transistors Q12 and Q11 constituting the first differential circuit 11 of the first basic gate 10. Thus, negative feedback is established. As a result, the two basic gates 10 and 20 constitute a ring oscillator, so that the phase of a signal is rotated 180°, i.e., inverted, in one cycle.

The common emitter of the first pair of emitter-coupled differential transistors Q11 and Q12 of the first differential circuit 11 and the common emitter of the first pair of emitter-coupled differential transistors Q21 and Q22 of the first differential circuit 21 are respectively connected to the collectors of a third pair of emitter-coupled differential transistors Q19 and Q29 which constitute a current switching circuit 30. The common emitter of the emitter-coupled differential transistors Q19 and Q29 is connected to a first current source CS1. The bases of the emitter-coupled differential transistors Q19 and Q29 are respectively connected to a pair of input terminals IN and /IN.

The common emitter of the second pair of emitter-coupled differential transistors Q13 and Q14 of the second differential circuit 12 of the basic gate 10 is connected to a second current source CS3. The common emitter of the second pair of emitter-coupled differential transistors Q23 and Q24 of the second differential circuit 22 of the basic gate 20 is connected to a third current source CS4.

The other ends (the ends which are not connected to the transistors) of the current sources CS1, CS3 and CS4 and the resistors R13, R14, R23 and R24 are connected to a low-potential power source terminal (in this embodiment, a negative power source Vee).

An operation of the frequency divider of this embodiment will now be described with reference to FIG. 3. In this frequency divider, the two basic gates 10 and 20 as a whole constitute a ring oscillator, which performs self-excited oscillation at a specific frequency (free-running frequency). When differential input signals, i.e., two input signals CK and /CK of opposite phases, are input to the input terminals IN and /IN, the frequency of the ring oscillator is forcibly changed by the frequency of these signals CK and /CK. As a result, differential output signals obtained by ½ frequency-dividing the frequency of the differential input signals CK and /CK are output from the emitter followers of the second basic gate 20 to the output terminals OUT and /OUT. This basic operation is the same as that of the conventional dynamic frequency divider.

Figure 4:
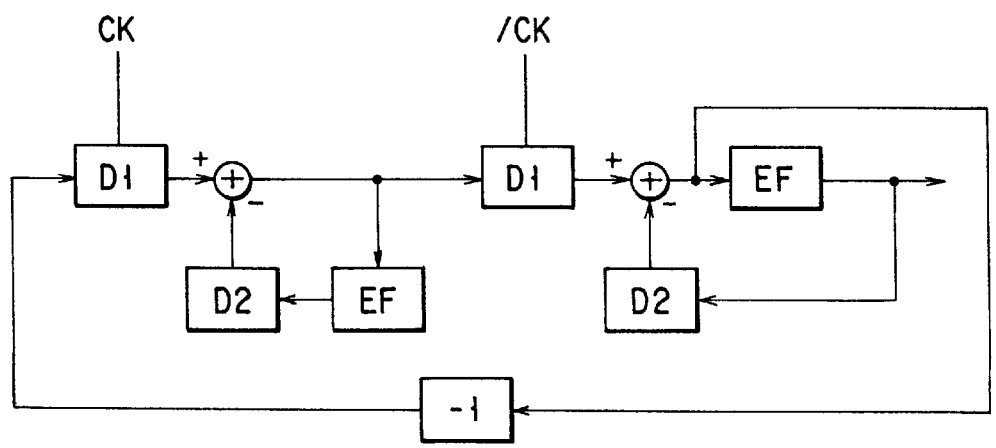
FIG. 4 is a block diagram of the frequency divider shown in FIG. 3.

FIG. 4 shows an equivalent circuit of the frequency divider shown in FIG. 3. Symbols D1 and D2 represent the first and second differential circuits (the pairs of emitter-coupled differential transistors) in the basic gates 10 and 20. A symbol EF represents an emitter follower. The second differential circuit D2 receives negative feedback through the emitter follower EF.

More specifically, in the first basic gate, an output of the emitter follower EF is fed back to an input of the second differential circuit D2. An output of the second differential circuit D2 is added to an output of the first differential circuit D1 in opposite phase. The addition output is fed back to the input of the second differential circuit D2 through the emitter follower EF. The addition output is also input directly to the first differential circuit D1 of the second basic gate, not through an emitter follower EF. In the second basic gate, an output of the emitter follower EF is fed back to an input of the second differential circuit D2. An output of the second differential circuit D2 is added to an output of the first differential circuit D1 in opposite phase. The addition output is fed back to the input of the second differential circuit D2 through the emitter follower EF. The addition output is also input directly to the first differential circuit D1 of the first basic gate, not through an emitter follower EF. Thus, negative feedback is established.

Actually, the addition in opposite phase of outputs of the first and second differential circuits D1 and D2 is addition of currents performed by the common collector loads of the first and second differential circuits 11 and 12 (21 and 22), i.e., the load resistors R11 and R12 (R21 and R22), shown in FIG. 3. Further, the addition result is converted by the resistors R11 and R12 (R21 and R22) to a voltage signal.

It is assumed that the resistance value of the load resistors R11, R12, R21 and R22 is RL, the current value of the first current source CS1 is $2I_1$, the current value of the second and third current sources CS3 and CS4 is $I_2$ ($=I_3=I_4$), the angular frequency of an output signal output from the pair of output terminals OUT and /OUT is $\omega$, and the delay time of the differential circuit is $\tau_{cs}$. In this case, if the delay time of the emitter follower is neglected, outputs $v_1(t)$ and $v_2(t)$ of the first and second differential circuits D1 and D2 are represented by the following equations (1) and (2). In the equations (1) and (2), $I_1$ represents an average current flowing through the third pair of emitter-coupled differential transistors Q19 and Q29, which is equal to ½ of the current value of the first current source CS1.

$$v_1(t) = R_L I_1 \sin(\omega(t-\tau_{cs})) \tag{1}$$

$$v_2(t) = R_L I_2 \sin(\omega(t-\tau_{cs})-\pi/2) \tag{2}$$

An output $V_0(t)$ after the addition is given by the following equation (3).

$$v_0(t) = R_L \sqrt{I_1^2 + I_2^2} \sin(\omega(t-\tau_{cs}) + \phi) \tag{3}$$

$$= R_L \sqrt{I_1^2 + I_2^2} \sin(\omega(t-\pi/2))$$

$$\phi = \tan^{-1} \frac{I_2}{I_1}$$

At this time, the free-running frequency $f_{freerun}$ is represented by the following equation (4), where $\tau_d$ denotes a delay time per basic gate.

$$f_{freerun} = \frac{1}{\pi \omega} \tag{4}$$

$$= \frac{1 + \frac{2}{\pi}\tan^{-1}\frac{I_2}{I_1}}{2\tau_{cs}} = \frac{1}{2\tau_d}$$

Figure 1:
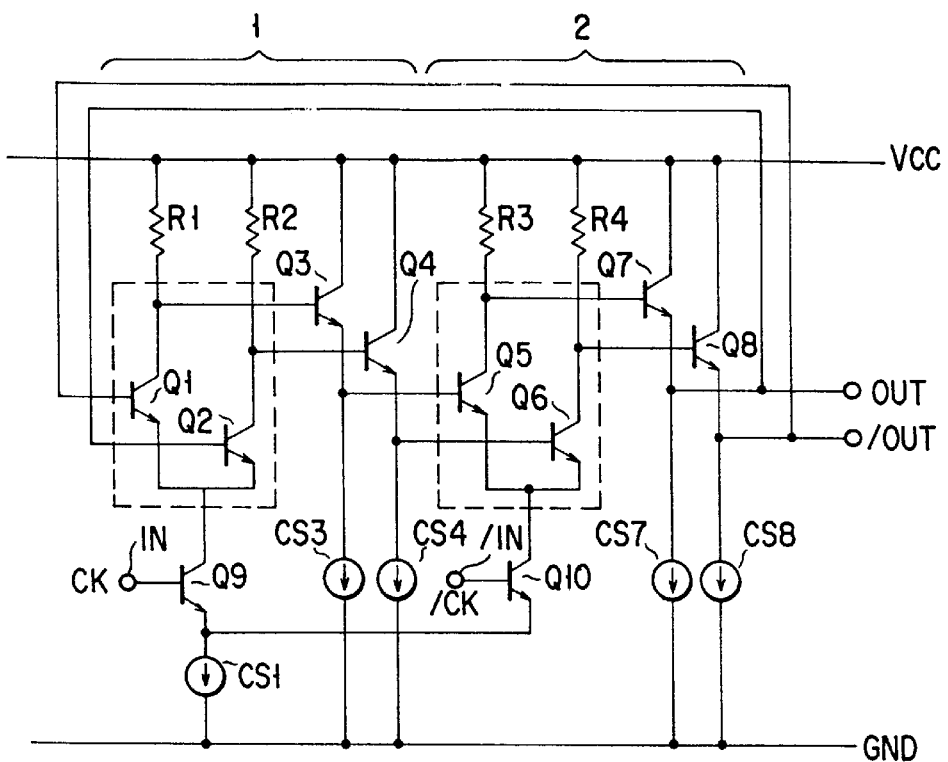
FIG. 1 is a circuit diagram of a conventional dynamic frequency divider.

On the other hand, the free-running frequency $f_{freerun}$ of the conventional frequency divider shown in FIG. 1 is represented by the following equation (5).

$$f_{freerun} = \frac{1}{2\tau_{cs}} \tag{5}$$

As described above, in the frequency divider of the present invention, the range of use frequency can be extended by changing the free-running frequency $f_{freerun}$. In addition, the frequency divider can perform a high-speed operation.

In the conventional dynamic frequency divider, the free-running frequency $f_{freerun}$ is determined by the delay time $\tau_d$ per basic gate, and $\tau_d$ is equal to the delay time rsc of the differential circuit as indicated in the equation (5). In this case, although the free-running frequency $f_{freerun}$ can be changed to a certain degree by changing the current flowing through the differential circuit, the amplitude of the output signal is also changed.

In contrast, according to the present invention, as indicated by the equation (4), the free-running frequency $f_{freerun}$ can be changed by changing the current $I_2$ supplied to the first differential circuits 12 and 22. Thus, if the current $I_2$ is increased, the free-running frequency $f_{freerun}$ can be higher and the frequency divider can be operated at a higher speed. In other words, according to the present invention, since negative feedback is established by the second differential circuit, if the amount of negative feedback is increased by increasing the current $I_2$, the delay time $\tau_d$ per basic gate can be smaller than the delay time $\tau_{cs}$ of the differential circuit, and the maximum division frequency can be higher accordingly. More specifically, the frequency divider of the present invention can be satisfactorily operated in a frequency band of several tens GHz.

Moreover, as can be understood from the equation (2), if the current $I_2$ supplied to the second differential circuit is changed in association with the current $I_1$ so as to keep constant the average of the squares of the values of the currents $I_1$ and $I_2$, the output $V_0$ after the addition can be kept constant, thereby maintaining the amplitude of an output signal of the frequency divider. Thus, the free-running frequency can be changed, while the amplitude of an output signal is kept constant.

Furthermore, in the frequency divider of this embodiment, as shown in FIGS. 3 and 4, a common collector output of the transistors Q11 and Q13 and a common collector output of the transistors Q12 and Q14 of the differential circuits 11 and 12, i.e., outputs of the first basic gate 10, are directly input to the second basic gate 20, not through the emitter follower constituted by the transistors Q17 and Q18. Therefore, the operation speed is further increased and the efficiency of utilizing the power source voltage is improved. The effect of this embodiment will be described below in detail with reference to a comparative example.

Figure 5:
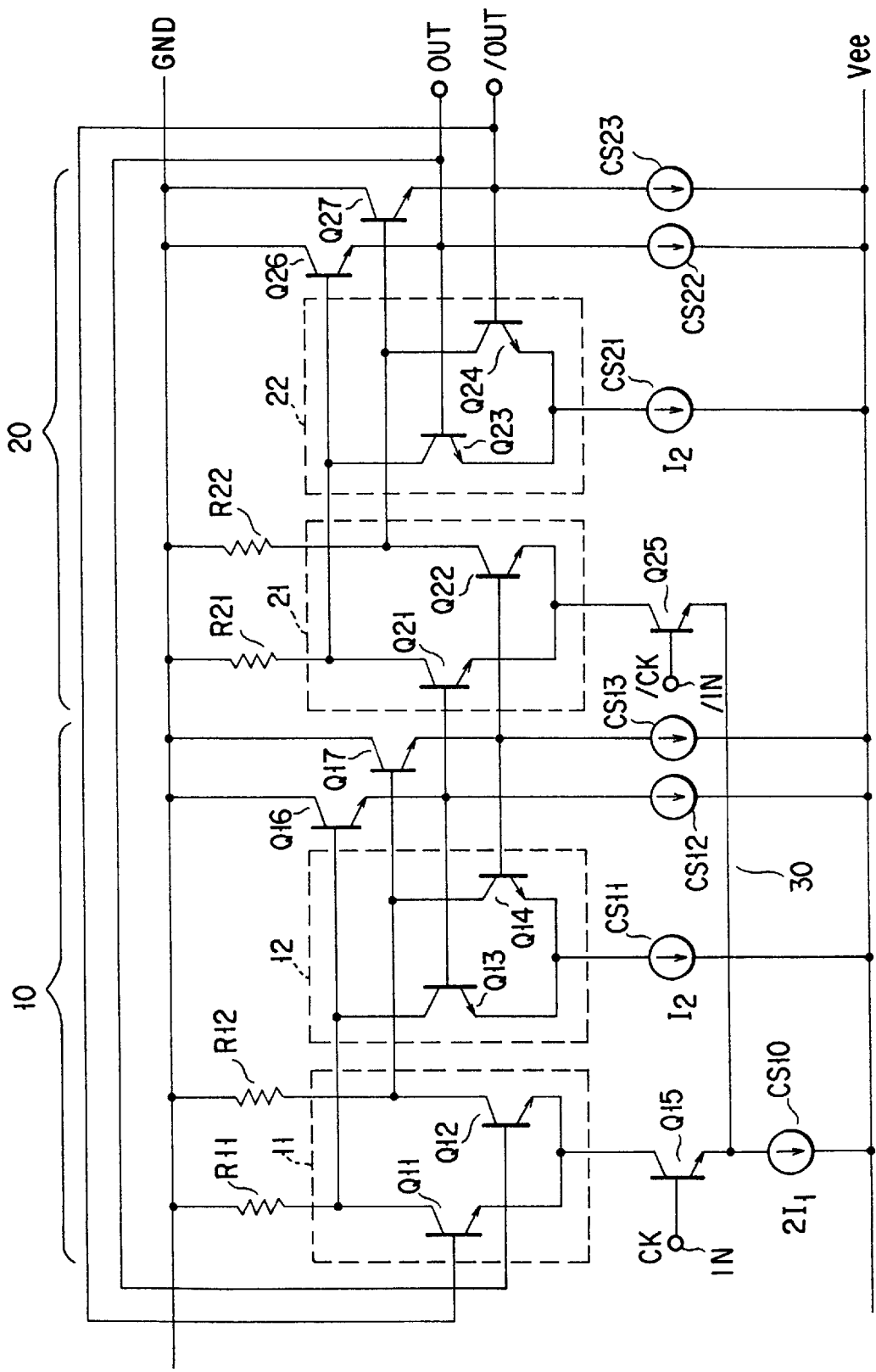
FIG. 5 is a circuit diagram of a frequency divider of a comparative example.
Figure 6:
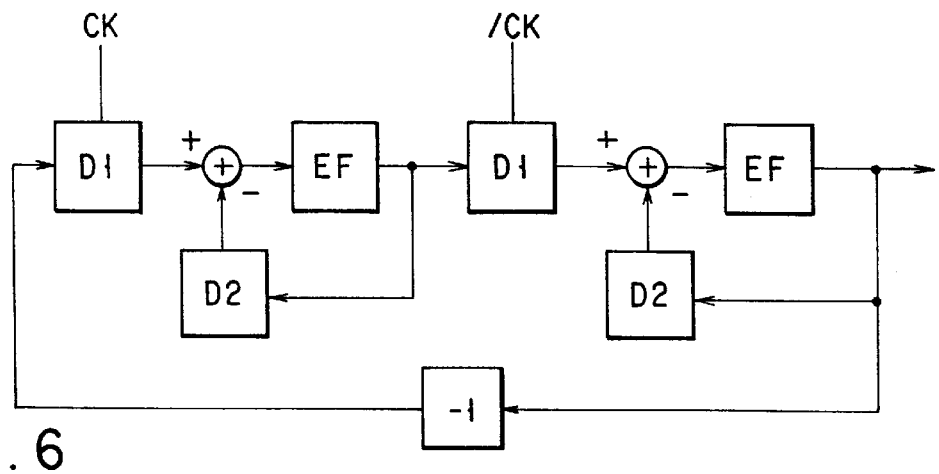
FIG. 6 is a block diagram of the frequency divider shown in FIG. 5.

FIG. 5 is a circuit diagram and FIG. 6 is a block diagram showing a frequency divider of a comparative example. The frequency divider of the comparative example is different from the embodiment shown in FIG. 3 in that a common collector output of the transistors Q11 and Q13 and a common collector output of the transistors Q12 and Q14 of the differential circuits 11 and 12, i.e., outputs of the first basic gate 10, are input to the second basic gate 20 through an emitter follower constituted by transistors Q16 and Q17.

In the comparative example, since the emitter follower constituted by the transistors Q16 and Q17 is interposed in the main signal transmission path, the signal transmission time includes the delay time of the emitter follower. On the other hand, according to the embodiment of the present invention shown in FIG. 3, the emitter follower constituted by the transistors Q17 and Q18 is not interposed in the main signal transmission path. Therefore, the signal transmission time does not include the delay time of the emitter follower. Consequently, the operation speed of this embodiment can higher than that of the structure shown in FIG. 5.

Further, in the comparative example shown in FIG. 5, the transistors Q16 and Q17 constituting the emitter follower of the basic gate 10, the pair of emitter-coupled differential transistors Q21 and Q22 of the first differential circuit 21 of the basic gate 20, and a transistor Q25 of a pair of emitter-coupled differential transistors Q15 and Q25 constituting a current switching circuit 30 are connected between the power source terminals GND and Vee. In this structure, assuming that the base-emitter voltage of a transistor is Vbe, the voltage across the power source terminals GND and Vee is about 3Vbe.

In contrast, in the structure of the embodiment shown in FIG. 3, the pair of emitter-coupled differential transistors Q21 and Q22 of the first differential circuit 21 of the basic gate 20 and the transistor Q29 of the pair of emitter-coupled differential transistors Q19 and Q29 constituting the current switching circuit 30 are connected between the power source terminals GND and Vee. However, the transistors Q17 and Q18 constituting the emitter follower of the basic gate 10 are connected between the power source terminals GND and Vee independently of the above transistors. Therefore, the voltage across the power source terminals GND and Vee is at most about 2Vbe. Thus, the efficiency of using the power source voltage is higher by Vbe. In other words, the power source voltage necessary for obtaining an output signal amplitude is lower than that necessary for obtaining the same amplitude in the comparative example. Alternatively, at the same power source voltage, the output signal amplitude of the embodiment can be greater than that of the comparative example.

In the frequency divider shown in FIG. 4, the emitter followers are not connected to the inputs of the pairs of emitter-coupled transistors D1 of the differential amplifiers of the first and second basic gates, but connected to the inputs of the pairs of emitter-coupled transistors D2 of the differential amplifiers of the first and second basic gates.

Figure 7:
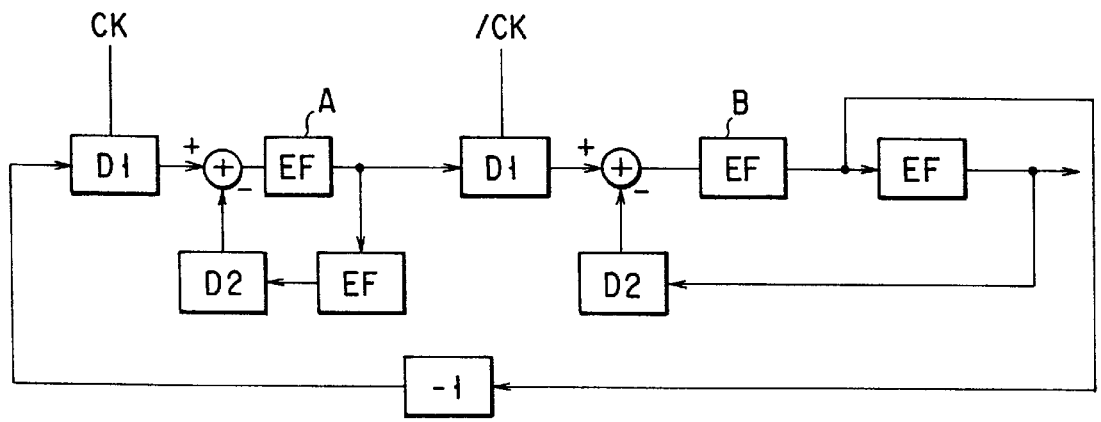
FIG. 7 is a block diagram of a modification of the frequency divider according to the first embodiment.

According to the present invention, however, as shown in FIG. 7, emitter followers A and B, which have a much shorter delay time than that of the emitter followers in the sub-loops, may be inserted in the main loops.

Second Embodiment

Figure 8:
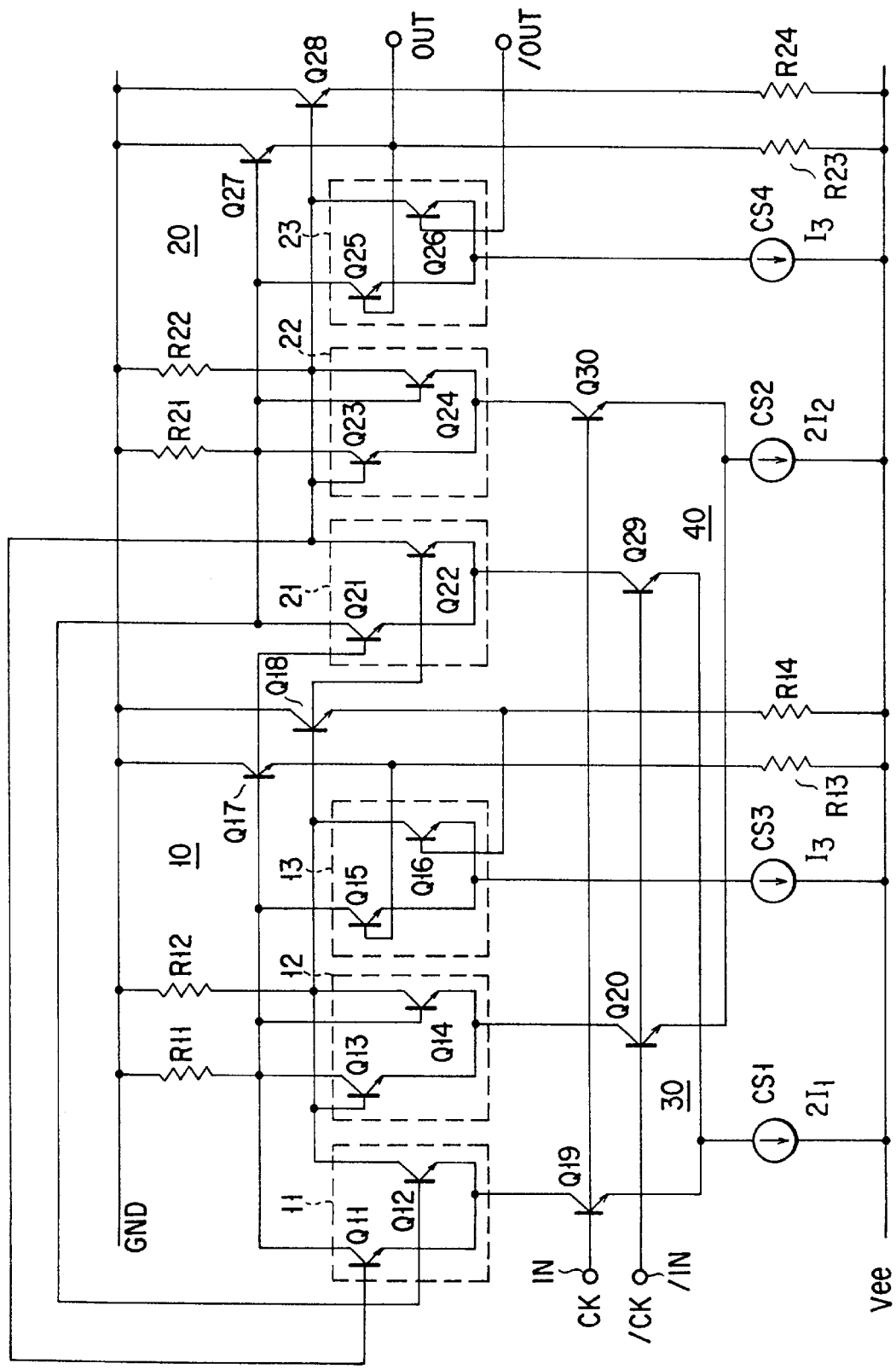
FIG. 8 is a circuit diagram of a frequency divider according to a second embodiment of the present invention.

FIG. 8 is a circuit diagram of a frequency divider according to a second embodiment of the present invention. In this embodiment, each of the basic gates 10 and 20 has three differential circuits. More specifically, the first basic gate 10 comprises first to third differential circuits 11, 12 and 13 and emitter followers constituted by transistors Q17 and Q18. The first to third differential circuits 11, 12 and 13 are connected to common collector loads, i.e., resistors R11 and R12, and constituted by pairs of emitter-coupled differential transistors Q11, Q12, Q13, Q14, Q15 and Q16. Similarly, the second basic gate 20 comprises first to third differential circuits 21, 22 and 23 and emitter followers constituted by transistors Q27 and Q28. The first to third differential circuits 21, 22 and 23 are connected to common collector loads, i.e., resistors R21 and R22, and constituted by pairs of emitter-coupled differential transistors Q21, Q22, Q23, Q24, Q25 and Q26.

In the first basic gate 10, the bases of the third pair of emitter-coupled differential transistors Q15 and Q16 (i.e., inputs of the third differential circuit 13) receive negative feedback from outputs of the emitter followers (i.e., outputs of the emitters of the transistors Q17 and Q18). Similarly, in the second basic gate 20, the bases of the third pair of emitter-coupled differential transistors Q25 and Q26 (i.e., inputs of the third differential circuit 23) receive negative feedback from outputs of the emitter followers (i.e., outputs of the emitters of the transistors Q27 and Q28).

The outputs of the first basic gate 10 are the common collector of the transistors Q11, Q12 and Q15 and the common collector of the transistors Q12, Q14 and Q16. They are connected to the bases of the first pair of differential transistors Q21 and Q22 of the second basic gate 20. On the other hand, the outputs of the second basic gate 20 are outputs of the first and second emitter followers (the emitters of the transistors Q27 and Q28) and respectively connected to a pair of output terminals OUT and /OUT.

The common collector of the transistors Q21, Q23 and Q25 and the common collector of the transistors Q22, Q24 and Q26 of the second basic gate 20 are respectively connected to the bases of the emitter-coupled differential transistors Q12 and Q11 constituting the first differential circuit 11 of the first basic gate 10. Thus, negative feedback is established. As a result, the two basic gates 10 and 20 constitute a ring oscillator, so that the phase of a signal is rotated 180°, i.e., inverted, in one cycle.

The common emitter of the first pair of emitter-coupled differential transistors Q11 and Q12 of the first differential circuit 11 and the common emitter of the first pair of emitter-coupled differential transistors Q21 and Q22 of the first differential circuit 21 are respectively connected to the collectors of a fourth pair of emitter-coupled differential transistors Q19 and Q29 which constitute a first current switching circuit 30. The common emitter of the emitter-coupled differential transistors Q19 and Q29 is connected to a first current source CS1. The bases of the emitter-coupled differential transistors Q19 and Q29 are respectively connected to a pair of input terminals IN and /IN.

The common emitter of the second pair of emitter-coupled differential transistors Q13 and Q14 of the second differential circuit 12 and the common emitter of the second pair of emitter-coupled differential transistors Q23 and Q24 of the second differential circuit 22 are respectively connected to the collectors of a fifth pair of emitter-coupled differential transistors Q20 and Q30 which constitute a second current switching circuit 40. The common emitter of the emitter-coupled differential transistors Q20 and Q30 is connected to a second current source CS2. The bases of the emitter-coupled differential transistors Q20 and Q30 are respectively connected to the pair of input terminals IN and /IN.

The common emitter of the third pair of emitter-coupled differential transistors Q15 and Q16 of the third differential circuit 13 of the basic gate 10 is connected to a third current source CS3. The common emitter of the third pair of emitter-coupled differential transistors Q25 and Q26 of the third differential circuit 23 of the basic gate 20 is connected to a fourth current source CS4.

Figure 9:
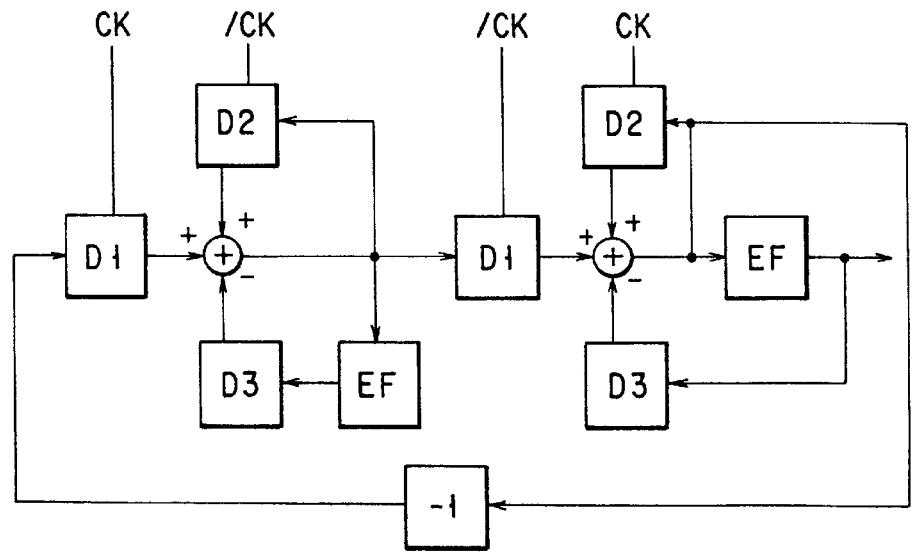
FIG. 9 is an equivalent circuit diagram of the frequency divider shown in FIG. 8.

FIG. 9 shows an equivalent circuit of the frequency divider shown in FIG. 8. In FIG. 9, symbols D1, D2 and D3 represent the first, second and third differential circuits, and a symbol EF represents an emitter follower.

In the frequency divider of this embodiment, the current supplied from the current sources CS1, CS2, CS3 and CS4 to the first, second and third differential circuits 11, 12 and 13 of the basic gates 10 and 20 are controlled. As a result, the lower limit of the division frequency is lowered, so that the range of the division frequency can be further extended. More specifically, in the frequency divider of the first embodiment shown in FIG. 3 and the frequency divider of the comparative example shown in FIG. 5, the lower limit of the division frequency is limited to 1/τS, where the switching time of the differential circuits of one basic gate is τS. In contrast, according to the frequency divider of this embodiment, the lower limit of the division frequency can be lower than 1/τS. This effect will be described below in detail.

Figure 2:
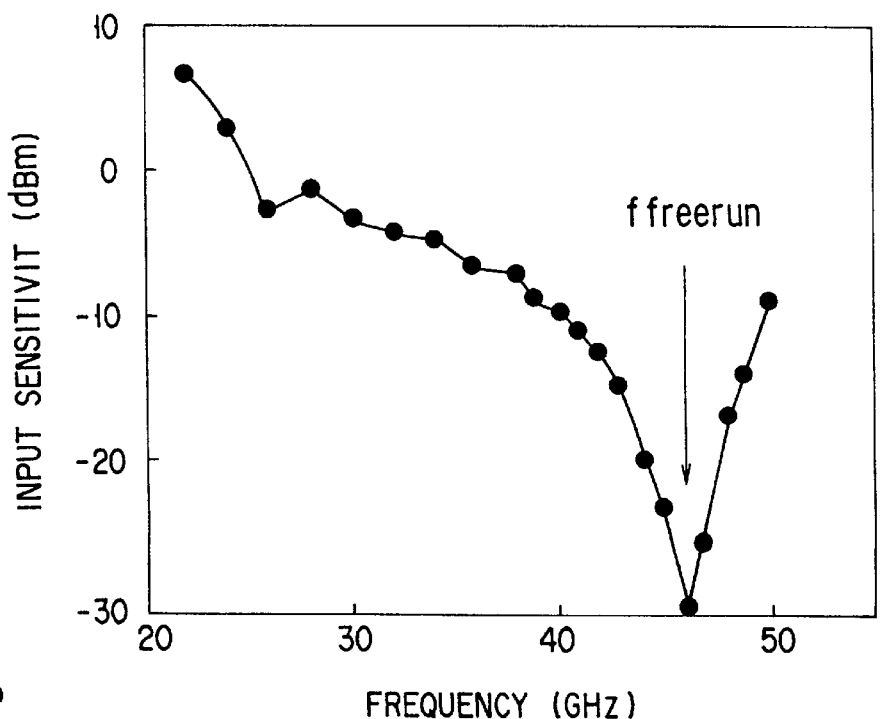
FIG. 2 is a diagram showing an input signal power sensitivity characteristic with respect to a division frequency of the frequency divider shown in FIG. 1.
Figure 10:
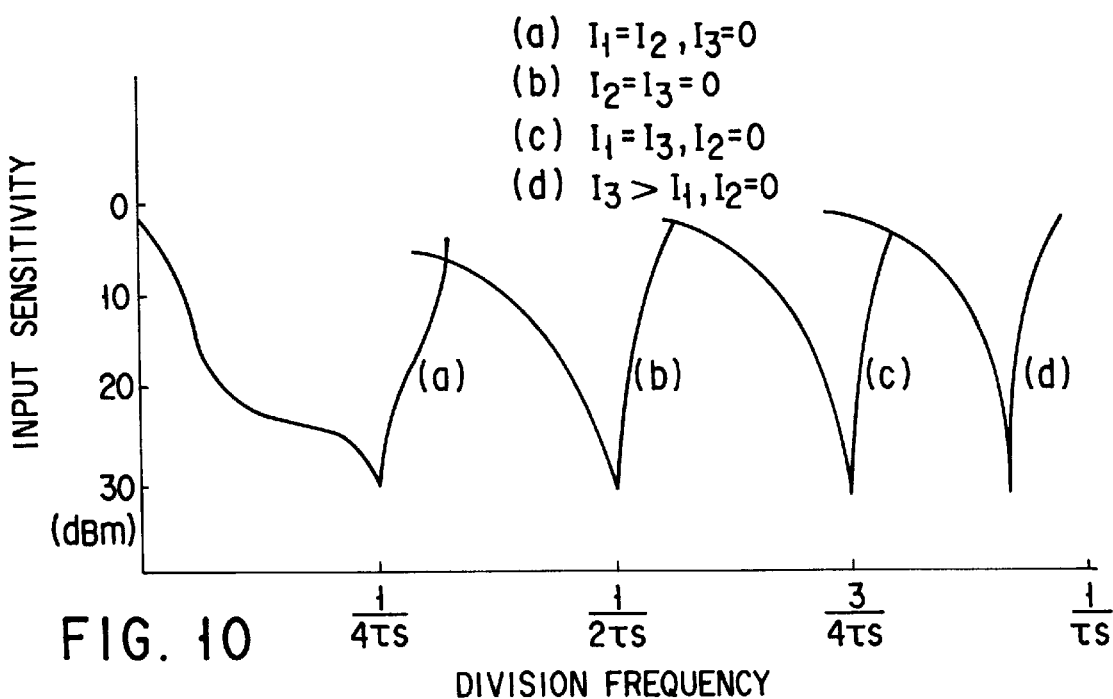
FIG. 10 is a diagram showing an input sensitivity characteristic with respect to a division frequency of the frequency divider shown in FIG. 8.

FIG. 10 is a characteristic diagram showing the relationship between an input sensitivity (which is the same as the input signal power sensitivity in FIG. 2) and a division frequency. In FIG. 10, the current value of the current source CS1 is defined as $2I_1$, the current value of the current source CS2 as $2I_2$, and the current value of the current sources CS3 and CS4 as $I_3$. The symbol τS, used to represent the division frequency on the abscissa, denotes the delay time of the pair of emitter-coupled differential transistors of a differential circuit.

In FIG. 10, the region (a) indicates a case where the current values of the current sources have the relationship $I_1=I_2$ and $I_3=0$, which corresponds to the conventional static frequency divider. The region (b) indicates a case where the current values of the current sources have the relationship $I_2=I_3=0$ which corresponds to the conventional dynamic frequency divider shown in FIG. 1. The region (c) indicates a case where the current values of the current sources have the relationship $I_1=I_3$ and $I_2=0$. In this case, the division frequency is about 1.5 times as high as that in the region (b). The region (d) indicates a case where the current values of the current sources have the relationship $I_1<I_3$ and $I_2=0$. The division frequency in this case corresponds to the maximum division frequency of the frequency divider shown in FIG. 8. It is about four times as high as that in the region (a) and about twice as high as that in the region (b).

Figure 11:
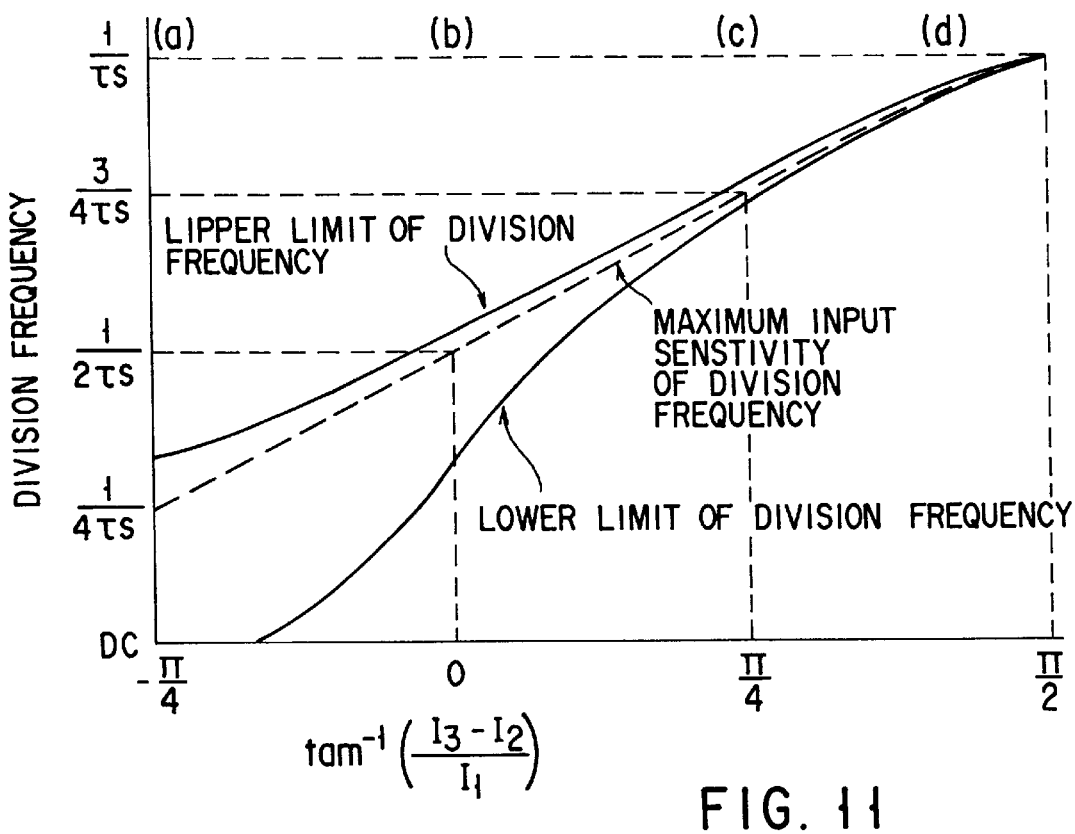
FIG. 11 is a diagram showing the relationship between a biasing current value and each of an upper limit of a division frequency, a lower limit of the division frequency and maximum input sensitivity of the frequency divider shown in FIG. 8.

FIG. 11 is a diagram showing the relationship between the value of the formula representing the current value of each current source, $\tan^{-1}((I_3-I_2)/I_1)$, and each of the upper limit of a division frequency, the lower limit thereof and maximum input sensitivity. The division frequency of the frequency divider of the comparative example shown in FIG. 5 falls within the range from the regions (b) to (d) shown in FIG. 11. In the frequency divider of this embodiment shown in FIG. 8, the region (a) shown in FIG. 11 is added to the variable range of the division frequency: that is, the division frequency of this embodiment can be varied in the range from the regions (a) to (d) shown in FIG. 11.

Third Embodiment

Figure 12:
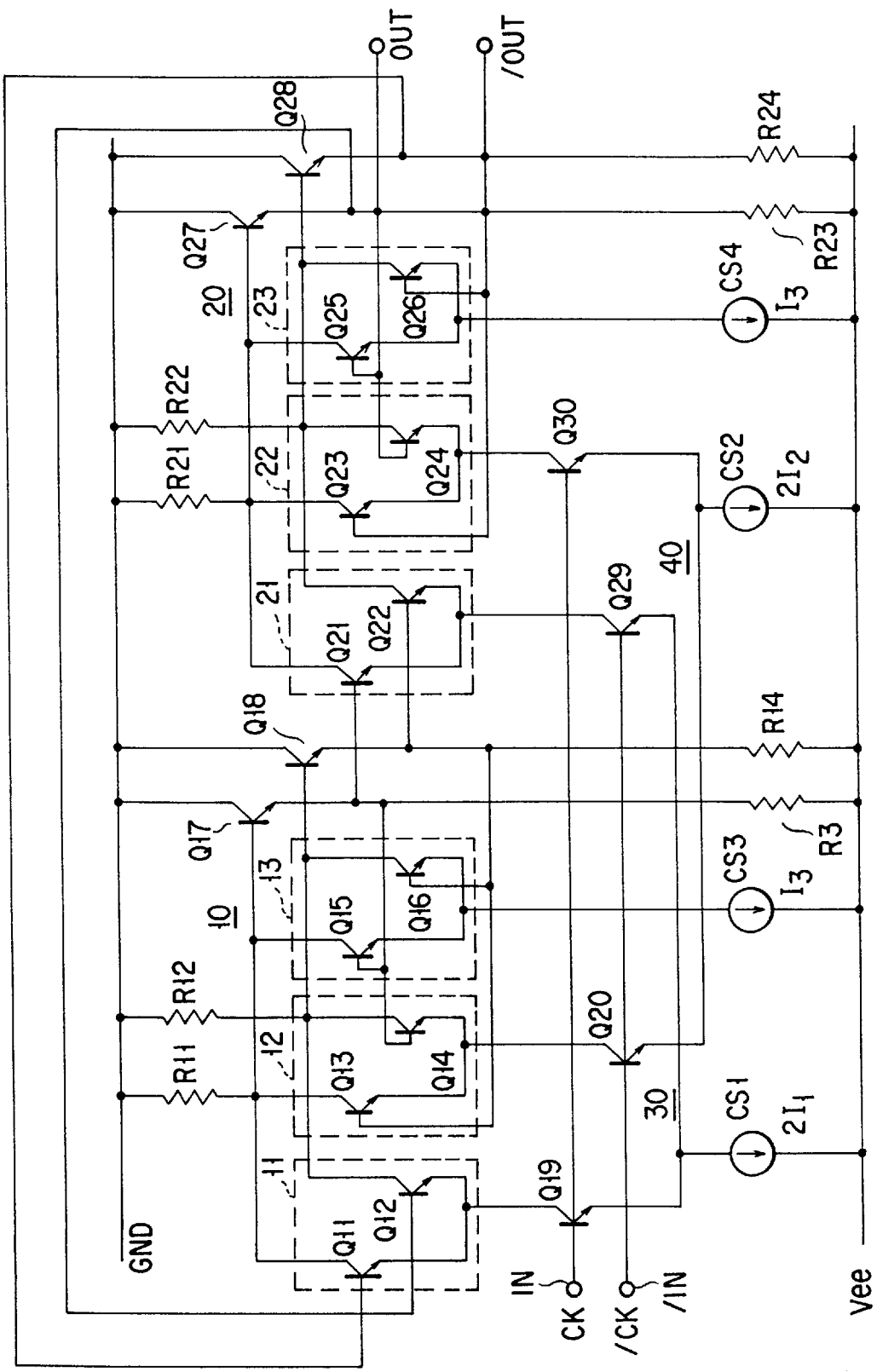
FIG. 12 is a circuit diagram of a frequency divider according to a third embodiment of the present invention.
Figure 13:
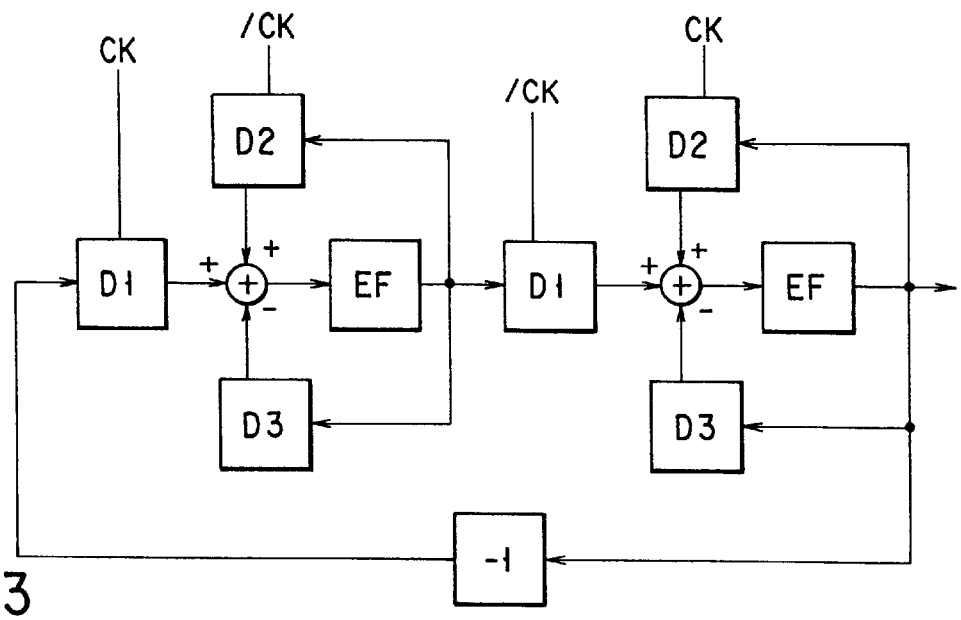
FIG. 13 is an equivalent circuit diagram of the frequency divider shown in FIG. 12.

FIG. 12 is a circuit diagram of a frequency divider according to a third embodiment of the present invention. The third embodiment is different from the frequency divider shown in FIG. 8 in that the bases of a pair of emitter-coupled differential transistors Q13 and Q14, constituting a second differential circuit 12 of the first basic gate 10, are connected to the emitters of transistors Q17 and Q18 constituting emitter followers; that the bases of a pair of emitter-coupled differential transistors Q23 and Q24, constituting a second differential circuit 22 of the second basic gate 20, are connected to the emitters of the transistors Q27 and Q28 constituting emitter followers; and that outputs of the emitter followers of the first basic gate 10 are connected to the bases of a pair of emitter-coupled differential transistors Q21 and Q22 of the first differential circuit 21 of the second basic gate 20. FIG. 13 shows an equivalent circuit of the frequency divider shown in FIG. 12.

With this embodiment, the upper limit of the division frequency is the same as that of the first embodiment shown in FIG. 3, whereas the lower limit thereof is the same as that of the second embodiment shown in FIG. 8.

Fourth Embodiment

Figure 15:
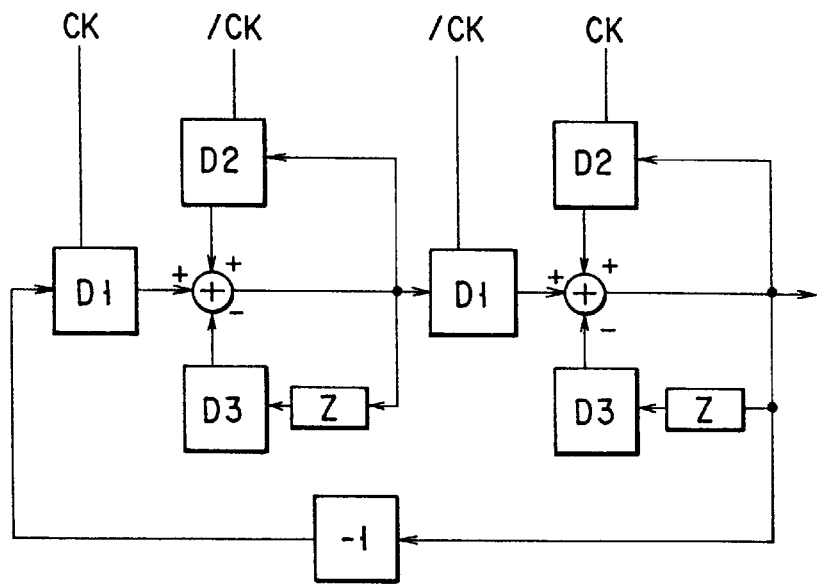
FIG. 15 is an equivalent circuit diagram of the frequency divider shown in FIG. 14.
Figure 14:
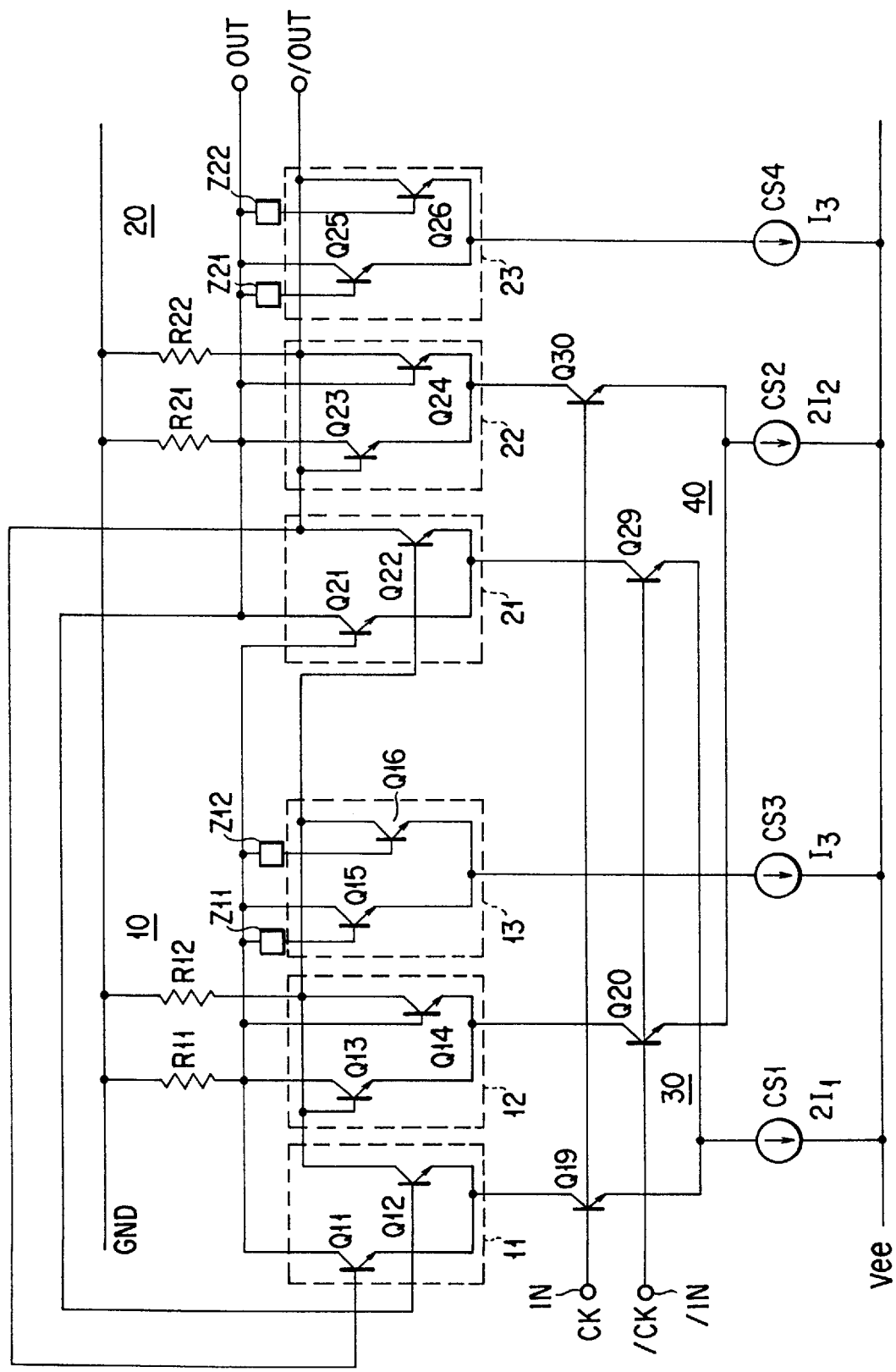
FIG. 14 is a circuit diagram of a frequency divider according to a fourth embodiment of the present invention.

FIG. 13 is a circuit diagram of a frequency divider according to a fourth embodiment of the present invention. In this embodiment, the emitter followers constituted by the transistors Q17, Q18, Q27 and Q28 of the frequency divider shown in FIG. 8 are replaced by impedance elements Z11, Z12, Z21 and Z22, such as inductance elements. FIG. 15 shows an equivalent circuit of the frequency divider shown in FIG. 14. In FIG. 15, the symbol Z represents the impedance elements Z11, Z12, Z21 and Z22.

According to this embodiment, the impedance elements formed of passive elements are used in place of the emitter followers as buffer circuits. As a result, the consumption of the current can be reduced by the difference in consumption between the emitter followers and the impedance elements.

Fifth Embodiment

Figure 16:
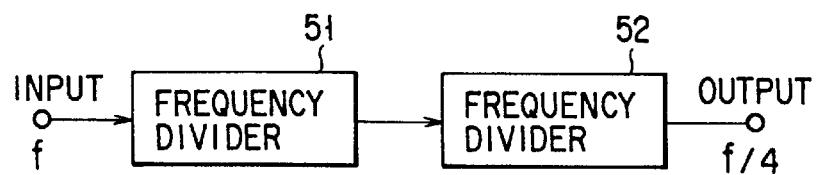
FIG. 16 is a structural diagram of a ¼ frequency divider according to a fifth embodiment of the present invention.

FIG. 16 shows a frequency divider according to a fifth embodiment of the present invention. In this embodiment, any of the frequency dividers of the first to third embodiments are connected in two stages, thereby forming a ¼ frequency divider. Any of the frequency dividers shown in FIGS. 3, 8, 12 and 14 may be used as frequency dividers 51 and 52 of the two stages. In the following, a case where the frequency divider shown in FIG. 8 is used is described.

The frequency dividers shown in FIG. 8 are used as the frequency dividers 51 and 52. The frequency divider 51 of the first stage is used at a division frequency in the region (d), and the current values of the current sources are set such that the maximum input sensitivity of the frequency of the frequency divider 52 of the second stage is equal to the output frequency of the frequency divider of the first stage in an intermediate region between the regions (a) and (b).

More specifically, when the current values $I_1$, $I_2$ and $I_3$ of the frequency divider 51 of the first stage are $I_{a1}$ $I_{a2}$ and $I_{a3}$, and the current values $I_1$, $I_2$ and $I_3$ of the frequency divider 52 of the second stage are $I_{b1}$, $I_{b2}$ and $I_{b3}$, these current values are set to satisfy the relationship represented by the following equation (6).

$$I_{a1}=0 \; \pi+4 \; \tan^{-1}((I_{b3}-I_{b2})/I_{b1})=2 \; \tan^{-1}(I_{a3}-I_{a1}) \quad (6)$$

Figure 17:
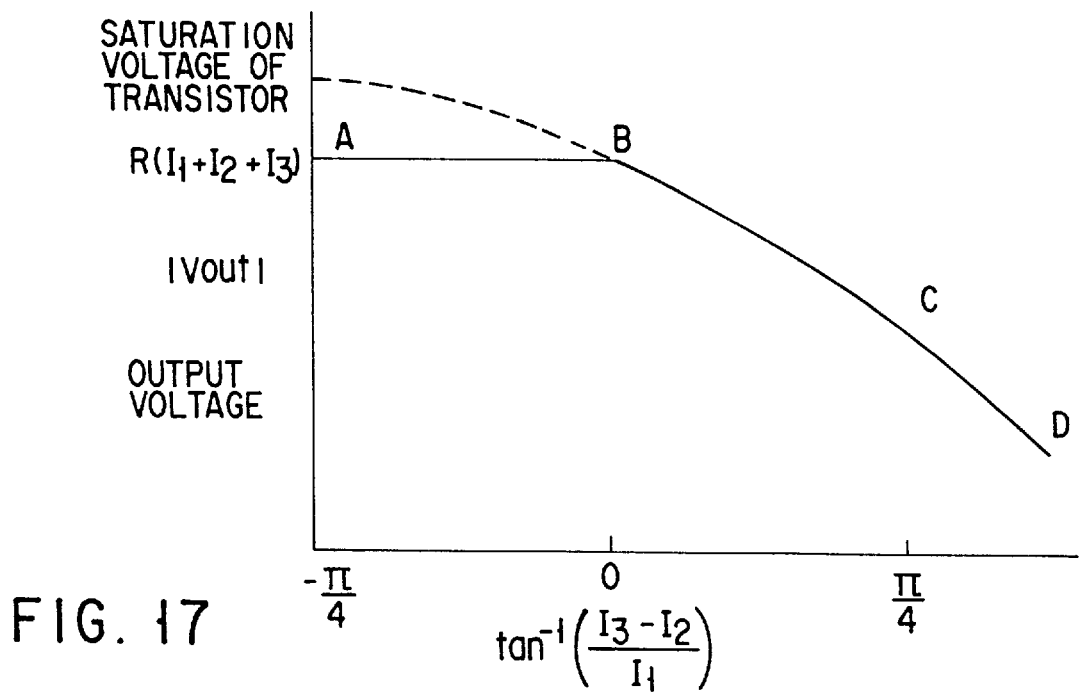
FIG. 17 is a diagram showing the relationship between a biasing current value and the amplitude of an output signal of the frequency divider shown in FIG. 16.
Figure 18A:
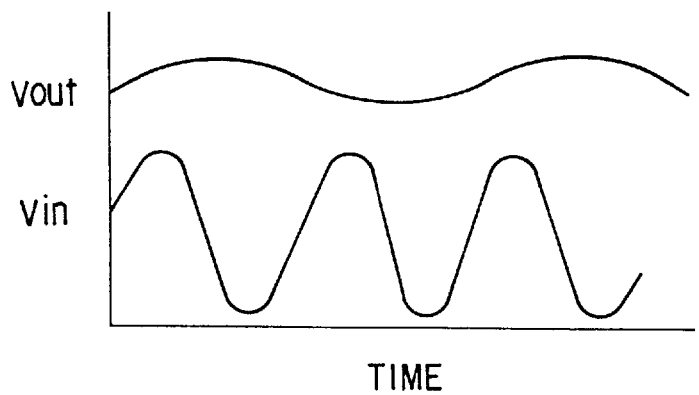
FIGS. 18A and 18B are diagrams showing input and output waveforms of the frequency divider shown in FIG. 16.
Figure 18B:
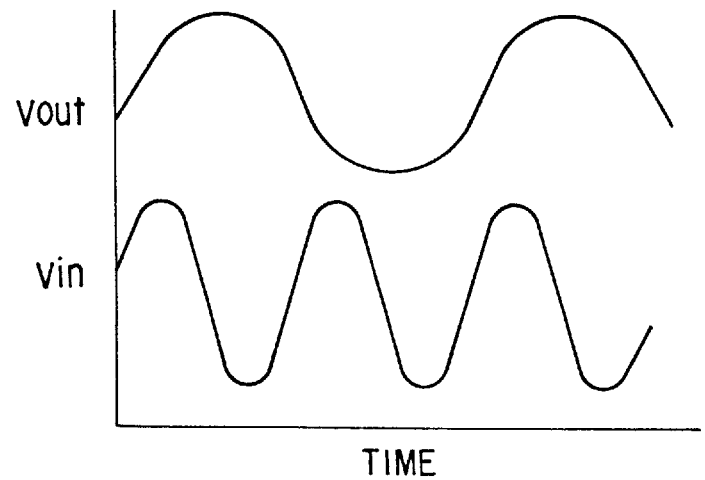

Since the degree of negative feedback to the third differential circuit is high in the region (d) shown in FIG. 10, the amplitude of an output signal is reduced as shown in FIG. 17, with the result that the amplitude of an output signal in the region (d) shown in FIG. 10 (the amplitude of an output signal in the region (d) is shown in FIG. 18A) becomes smaller than that of an output signal in the region (a) shown in FIG. 10 (the amplitude of an output signal in the region (a) is shown in FIG. 18B). Therefore, the input sensitivity of the frequency divider 52 of the second stage must be high in order for the frequency divider to be operated at a small voltage amplitude. For this reason, the current values are set to satisfy the above equation (6). In FIGS. 18A and 18B, Vin represents an input signal waveform, and Vout represents an output signal waveform.

Sixth Embodiment

Figure 19:
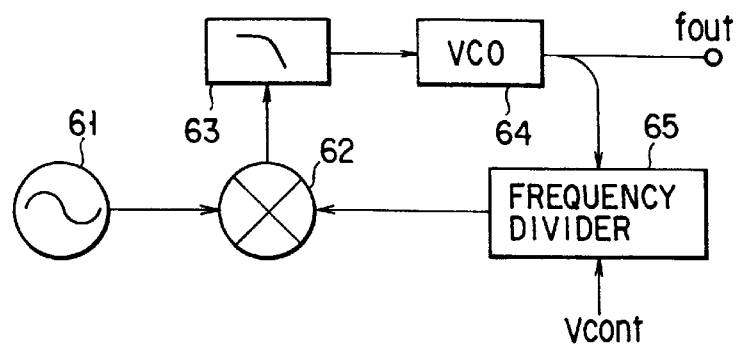
FIG. 19 is a block diagram of a phase lock circuit according to a sixth embodiment of the present invention.
Figure 20:
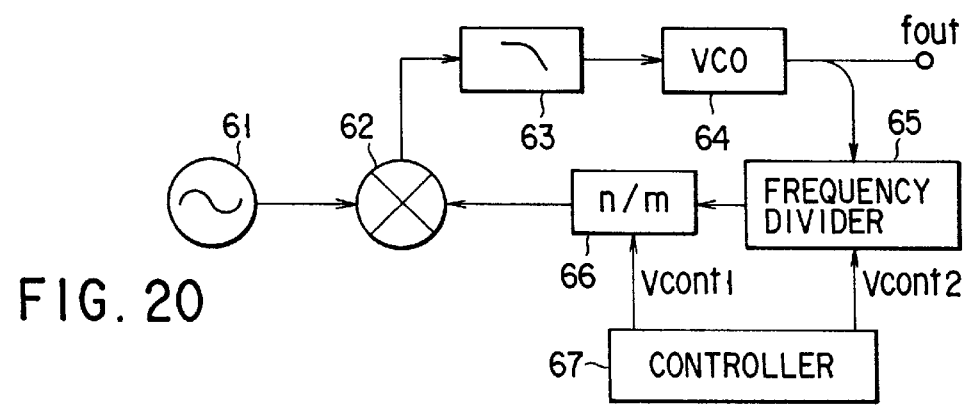
FIG. 20 is a block diagram of another phase lock circuit according to the sixth embodiment of the present invention.

FIGS. 19 and 20 show phase lock circuits according to a sixth embodiment of the present invention, in which the frequency divider of the present invention is connected to a voltage controlled oscillator.

The phase lock circuit shown in FIG. 19 comprises a reference oscillator 61, a phase comparator 62, a low-pass filter 63, a voltage controlled oscillator (VCO) 64 and a frequency divider 65. The frequency divider 65 divides an oscillation frequency of the VCO 64. The signal thus obtained by the frequency divider 65 is compared with an output signal from the reference oscillator 61 by the phase comparator 62, thereby detecting a phase difference between the signals. The phase difference signal thus obtained is supplied as a control voltage to the VCO 64 through the low-pass filter 63. As a result, assuming that the frequency division ratio of the frequency divider 65 is 1/N, the VCO 64 can be oscillated at a frequency fout, which is N times as high as the oscillation frequency of the reference oscillator 61.

The phase lock circuit shown in FIG. 20 is different from that shown in FIG. 19 in that an n/m programmable frequency divider 66 is inserted between the frequency divider 65 and the phase comparator 62. The frequency division ratios of the frequency divider 65 and the programmable frequency divider 66 are controlled by control signals $V_{cont2}$ and $V_{cont1}$ supplied from a controller 67.

The frequency divider 65 is the frequency divider of the present invention described above. When the input signal frequency, at which the input sensitivity is the highest, is set to coincide with the oscillation frequency of the VCO 64, the frequency divider 65 can perform a frequency-dividing operation with much lower power as compared to output power of the VCO 64. Therefore, even if the coupling between the VCO and the frequency divider 65 is loose, the load loss of the VCO may increase little.

Figure 21:
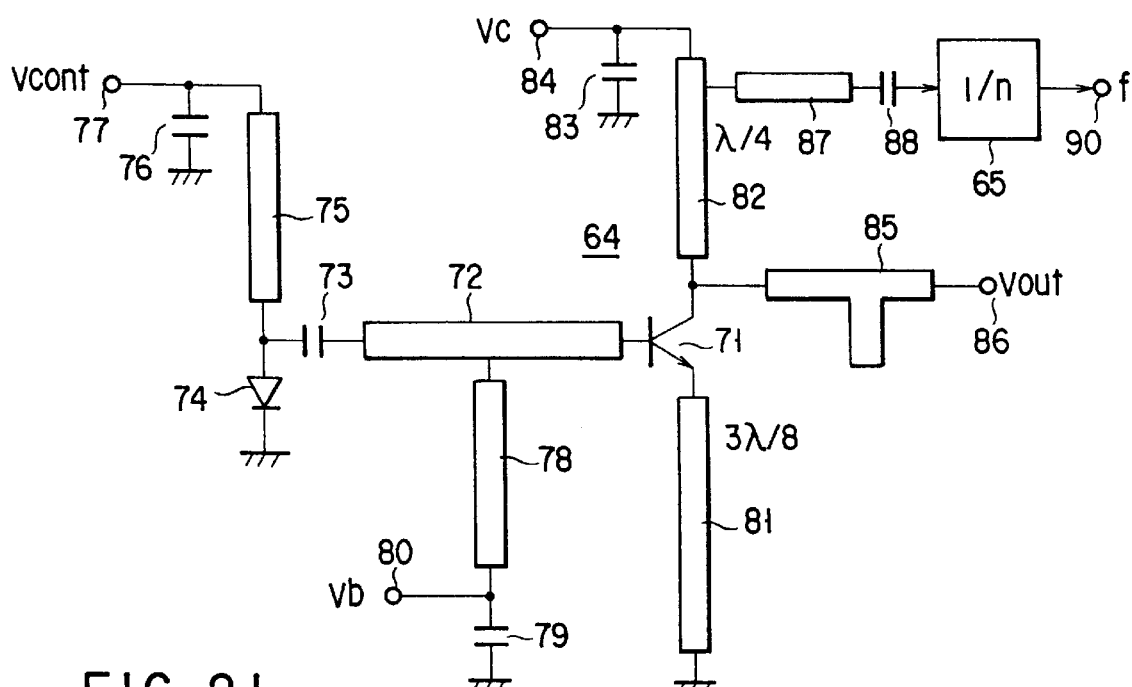
FIG. 21 is a diagram showing concrete structures of the voltage controlled oscillator and the frequency divider shown in FIG. 19 or 20, and peripheral circuits.

FIG. 21 shows concrete structures of the VCO 64, the frequency divider 65 and peripheral circuits. In the phase lock circuit, at least the VCO 64 and the frequency divider 65 are formed in one microwave integrated circuit (MIC) chip. An MIC is an integrated circuit wherein a monolithic IC forming a circuit, transmission paths and various discrete elements are mounted on a dielectric substrate. The VCO 64 is a serial feedback oscillator mainly comprising a transistor 71, a dielectric transmission path 72 one end of which is connected to the base of the transistor 71, and a varactor diode 74 connected to the other end of the transmission path 72 through a direct current stopping capacitor 73. The transmission path 72 and the varactor diode 74 constitute a resonator.

The cathode of the varactor diode 74 is grounded, and the anode thereof is connected to the open end of a varactor bias supplying short stub 75. Assuming that the wavelength at an oscillation central frequency of the VCO 64 is $\lambda$, the length of the varactor bias supplying short stub 75 is set to, for example, $\lambda/4$. The short end of the varactor bias supplying short stub 75 is grounded through a grounding capacitor 76 and connected to a control voltage input terminal 77. The control voltage input terminal 77 receives a control voltage Vcont output from, for example, the low-pass filter 63 shown in FIG. 19 or FIG. 20. The control voltage Vcont changes the static capacitance of the varactor diode 74, thereby changing the oscillation frequency of the VCO 64.

A base bias voltage Vb is applied to the base of the transistor 71 through a part of the transmission path 72 and a base bias supplying short stub 78. The length of the base bias supplying short stub 78 is also set to, for example, $\lambda/4$. The open end of the base bias supplying short stub 78 is connected to a middle portion of the transmission path 72, and the short end thereof is grounded through a grounding capacitor 79 and connected to a base bias power source terminal 80.

The emitter of the transistor 71 is grounded through a capacitive short stub 81 for increasing a negative resistance of the transistor 71. The length of the capacitive short stub 81 is set to, for example, $3\lambda/8$.

A collector bias voltage Vc is applied to the collector of the transistor 71 through a collector bias supplying short stub 82. The length of the collector bias supplying short stub 82 is also set to, for example, $\lambda/4$. The open end of the collector bias supplying short stub 82 is connected to the collector of the transistor 71, and the short end thereof is grounded through a grounding capacitor 83 and connected to a collector bias power source terminal 84. The collector of the transistor 71 is connected to an output terminal 86 through a transmission path 85 for taking out an output of the VCO 64. An output Vout of the VCO 64 is output through the output terminal 86.

An input terminal of the frequency divider 65 is connected to a portion near the short end of the collector bias supplying short stub 82 through a transmission path 87 and a direct current stopping capacitor 88. A signal having a frequency f/n, i.e., 1/n of the oscillation frequency f of the VCO 64 is output from an output terminal 90 of the frequency divider 65. The direct current stopping capacitor 88 is constituted by, for example, an MIM capacitor. It is preferable that the position where the input terminal of the frequency divider 65 is connected to the collector bias supplying short stub 82 through the transmission path 87 and the current stopping capacitor 88 is as close as possible to the short end so far as a signal voltage sufficient to operate the frequency divider 65 is generated, specifically, at a distance of $\lambda/16$ or less from the short end.

With this structure, a voltage fully lower than that the output amplitude of the transistor 71 can be input to the frequency divider 65. Thus, the advantage that the load loss of the VCO 64 is not increased is obtained.

Seventh Embodiment

Figure 22:
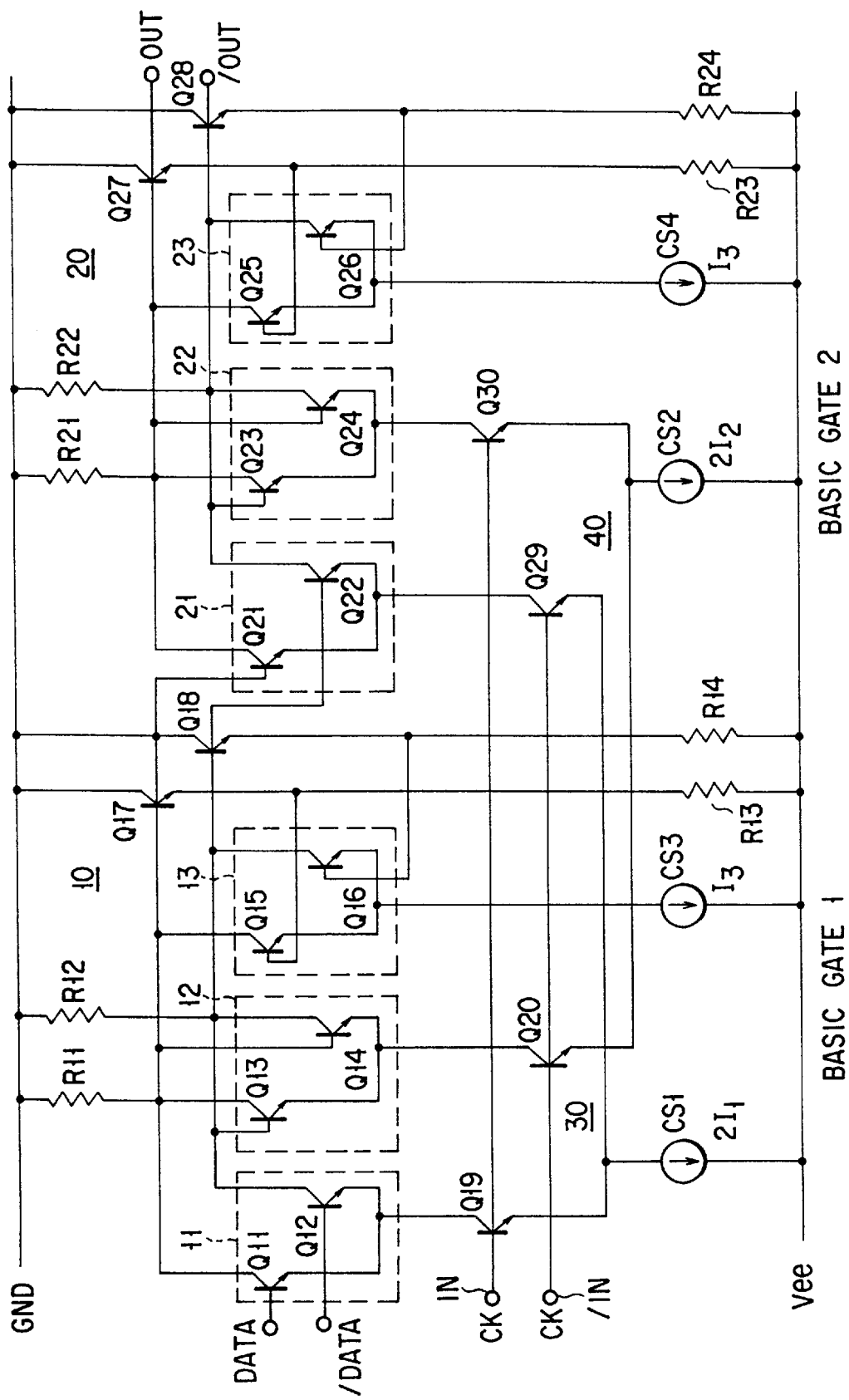
FIG. 22 is a circuit diagram of a D flip-flop according to a seventh embodiment of the present invention.

FIG. 22 shows a seventh embodiment of the present invention, in which the feedback loops in the second embodiment shown in FIG. 8 are cut to form a D flip-flop. In this case, the circuit is used mainly at a frequency lower than the region (b) in FIG. 10. The current values have the relationship $I_1 > I_2 > I_3$.

With this structure, the gate delay due to a negative feedback can be reduced and the operation speed can be increased as compared to the conventional D flip-flop which does not have third differential circuits 13 and 23 (emitter-coupled differential transistor pairs Q15 and Q16, and Q25 and Q26) that receive negative feedback.

As described above, in the frequency divider of the present invention, the second differential circuit receives negative feedback through the buffer circuit (emitter follower) which constitutes a basic gate along with the first differential circuit, so that the current supplied from the common current source to the first differential circuits and the current supplied from the individual current sources to the second differential circuits of the two basic gates can be changed. As a result, the range of the use frequency can be extended by changing the free-running frequency, while the amplitude of an output signal is not considerably changed. In addition, the delay time per basic gate can be reduced, so that a high-speed operation can be performed.

Further, in the frequency divider of the present invention, common collector outputs of the emitter-coupled differential transistor pairs constituting the first and second differential circuits are output from the first basic gate, and directly input to the first differential circuit of the second basic gate, not through a buffer circuit such as an emitter follower. Therefore, since the delay time of the buffer circuit of the first basic gate is not included in the signal transmission time, the operation speed can be accordingly higher than in the case where an output from the buffer circuit of the first basic gate is input to the second basic gate.

Furthermore, in this structure, since the buffer circuit of the first basic gate is connected to the first differential circuit and the current switching circuit of the second basic gate, the efficiency of utilizing the power source voltage is improved. In other words, as compared to the conventional art, the same output signal amplitude can be obtained at a lower power source voltage, or the output amplitude can be greater at the same power source voltage.

Moreover, according to the present invention, the basic gate may comprise three differential circuits. In this case, the lower limit of the division frequency can be lowered to extend the variable range of the division frequency.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A frequency divider comprising:
   first and second basic gates, each including first and second differential circuits, an adder unit for adding outputs from the first and second differential circuits and a buffer circuit to which an output from the adder unit is input,
   wherein the adder units of the first and second basic gates receive negative feedback from outputs from the adder units of the first and second basic gates through the second differential circuits of the first and second basic gates and the buffer circuits of the first and second basic gates, respectively, an output from the adder unit of the first basic gate is directly input to the first differential circuit of the second basic gate, and an output from the adder unit of the second basic gate is fed back to an input of the first differential circuit of the first basic gate;

a first current source for supplying a current in common to the first differential circuits of the first and second basic gates;

a first current switching circuit inserted between the first current source and the first differential circuits of the first and second basic gates; and second and third current sources for respectively supplying currents to the second differential circuits of the first and second basic gates, wherein a differential input signal is input to the first current switching circuit and a frequency-divided output signal is obtained from the buffer circuit of the second basic gate.

2. A frequency divider according to claim 1, wherein each of the first and second basic gates further includes a third differential circuit, the adder units of the first and second basic gates add outputs of the first to third differential circuits of the first and second basic gates respectively, and outputs from the adder units of the first and second basic gates are respectively input to the third differential circuits of the first and second basic gate, the frequency divider further comprising:
a fourth current source for supplying a current in common to the third differential circuits of the first and second basic gates; and
a second current switching circuit inserted between the fourth current source and the third differential circuits of the first and second basic gates,
wherein a differential input signal is input to the first and second current switching circuits and a frequency-divided output signal is obtained from the buffer circuit of the second basic gate.

3. A frequency divider according to claim 1, wherein each of the first and second basic gates further includes a third differential circuit, the adder units of the first and second basic gates add outputs of the first to third differential circuits of the first and second basic gates respectively, and outputs from the adder units are respectively input to the third differential circuits through the buffer circuits of the first and second basic gates, the frequency divider further comprising:
a fourth current source for supplying a current in common to the third differential circuits of the first and second basic gates; and
a second current switching circuit inserted between the fourth current source and the third differential circuits of the first and second basic gates,
wherein a differential input signal is input to the first and second current switching circuits and a frequency-divided output signal is obtained from the buffer circuit of the second basic gate.

4. A phase lock oscillator comprising:
a voltage controlled oscillator for generating a signal having a predetermined frequency; and
a frequency divider according to claim 1 for frequency-dividing the signal generated from the voltage controlled oscillator,
wherein the voltage controlled oscillator is controlled based on a difference between a reference signal and a signal frequency-divided by the frequency divider.

5. A phase lock oscillator comprising:
a voltage controlled oscillator for generating a signal having a predetermined frequency; and
a frequency divider according to claim 2 for frequency-dividing the signal generated from the voltage controlled oscillator,
wherein the voltage controlled oscillator is controlled based on a difference between a reference signal and a signal frequency-divided by the frequency divider.

6. A phase lock oscillator comprising:
a voltage controlled oscillator for generating a signal having a predetermined frequency; and
a frequency divider according to claim 3 for frequency-dividing the signal generated from the voltage controlled oscillator,
wherein the voltage controlled oscillator is controlled based on a difference between a reference signal and a signal frequency-divided by the frequency divider.

7. A phase lock oscillator according to claim 5, wherein the voltage controlled oscillator and the frequency divider are mounted on a microwave integrated circuit chip.

8. A phase lock oscillator according to claim 6, wherein the voltage controlled oscillator and the frequency divider are mounted on a microwave integrated circuit chip.

9. A phase lock oscillator according to claim 4, wherein the voltage controlled oscillator and the frequency divider are mounted on a microwave integrated circuit chip.

10. A frequency divider comprising:
first and second basic gates, each including first and second pairs of emitter-coupled differential transistors, and first and second emitter followers to which common collector outputs of the first and second pairs of emitter-coupled differential transistors are input, and outputs of which are respectively connected to bases of the second pair of emitter-coupled differential transistors,
wherein common collector outputs of the first and second pairs of emitter-coupled differential transistors of the first basic gate are respectively directly input to bases of the first pair of emitter-coupled transistors of the second basic gate, and common collector outputs of the first and second pairs of emitter-coupled transistors of the second basic gate are respectively fed back to bases of the first pair of emitter-coupled differential transistors of the first basic gate;
a third pair of emitter-coupled differential transistors, collectors of which are connected to common emitters of the first pairs of emitter-coupled differential transistors of the first and second basic gates;
a first current source connected to a common emitter of the third pair of emitter-coupled differential transistors; and
second and third current sources respectively connected to common emitters of the second pairs of emitter-coupled differential transistors of the first and second basic gates,
wherein a differential input signal is input to bases of the third pair of emitter-coupled differential transistors and a frequency-divided differential output signal is obtained from the first and second emitter followers of the second basic gate.

11. A frequency divider according to claim 10, wherein:
each of the first and second basic gates includes a fourth pair of emitter-coupled differential transistors;
collector outputs of the fourth pair of emitter-coupled differential transistors of the first basic gate are respectively input to bases of the first pair of emitter-coupled differential transistors of the second basic gate; and collector outputs of the fourth pair of emitter-coupled differential transistors of the second basic gate are respectively fed back to bases of the first pair of emitter-coupled differential transistors of the first basic gate, the frequency divider further comprising:

a fifth pair of emitter-coupled differential transistors, collectors of which are connected to common emitters of the fourth pairs of emitter-coupled differential transistors of the first and second basic gates; and a fourth current source connected to a common emitter of the fifth pair of emitter coupled differential transistors, wherein a differential input signal is input to bases of the third pair of emitter-coupled differential transistors and the fifth pair of emitter-coupled differential transistors and a frequency-divided differential output signal is obtained from the first and second emitter followers of the second basic gate.

12. A phase lock oscillator comprising:

a voltage controlled oscillator for generating a signal having a predetermined frequency; and a frequency divider according to claim 10 for frequency-dividing the signal generated from the voltage controlled oscillator, wherein the voltage controlled oscillator is controlled based on a difference between a reference signal and a signal frequency-divided by the frequency divider.

13. A phase lock oscillator comprising:

a voltage controlled oscillator for generating a signal having a predetermined frequency; and a frequency divider according to claim 11 for frequency-dividing the signal generated from the voltage controlled oscillator, wherein the voltage controlled oscillator is controlled based on a difference between a reference signal and a signal frequency-divided by the frequency divider.

14. A frequency divider comprising:

first and second basic gates, each including first to third pairs of emitter-coupled differential transistors, and first and second emitter followers to which common corrector outputs of the first to third pairs of emitter-coupled differential transistors are input, and outputs of which are input to bases of the third pair of emitter-coupled differential transistors, wherein outputs of the first and second emitter followers of the first basic gate are respectively connected to bases of the first pair of emitter-coupled transistors of the second basic gate, and outputs of the first and second emitter followers of the second basic gate are respectively fed back to bases of the first pair of emitter-coupled differential transistors of the first basic gate;

a fourth pair of emitter-coupled differential transistors, collectors of which are connected to common emitters of the first pairs of emitter-coupled differential transistors of the first and second basic gates;

a first current source connected to a common emitter of the fourth pair of emitter-coupled differential transistors;

a fifth pair of emitter-coupled differential transistors, collectors of which are connected to common emitters of the second pairs of emitter-coupled differential transistors of the first and second basic gates;

a second current source connected to a common emitter of the fifth pair of emitter-coupled differential transistors; and third and fourth current sources respectively connected to common emitters of the third pairs of emitter-coupled differential transistors of the first and second basic gates, wherein a differential input signal is input to bases of the fourth and fifth pairs of emitter-coupled differential transistors and a frequency-divided differential output signal is obtained from the first and second emitter followers of the second basic gate.

15. A phase lock oscillator comprising:

a voltage controlled oscillator for generating a signal having a predetermined frequency; and a frequency divider according to claim 14 for frequency-dividing the signal generated from the voltage controlled oscillator, wherein the voltage controlled oscillator is controlled based on a difference between a reference signal and a signal frequency-divided by the frequency divider.

16. A phase lock oscillator according to claim 13, wherein the voltage controlled oscillator and the frequency divider are mounted on a microwave integrated circuit chip.

17. A phase lock oscillator according to claim 12, wherein the voltage controlled oscillator and the frequency divider are mounted on a microwave integrated circuit chip.

18. A phase lock oscillator according to claim 15, wherein the voltage controlled oscillator and the frequency divider are mounted on a microwave integrated circuit chip.

19. A flip-flop circuit comprising:

first and second basic gates, each including first to third pairs of emitter-coupled differential transistors, and first and second emitter followers to which common corrector outputs of the first to third pairs of emitter-coupled differential transistors are input, and outputs of which are respectively input to bases of the second pair of emitter-coupled differential transistors, wherein common collector outputs of the first to third pairs of emitter-coupled differential transistors of the first basic gate are respectively input to bases of the first pair of emitter-coupled transistors of the second basic gate;

a fourth pair of emitter-coupled differential transistors, collectors of which are respectively connected to common emitters of the first pairs of emitter-coupled differential transistors of the first and second basic gates;

a first current source connected to a common emitter of the fourth pair of emitter-coupled differential transistors;

second and third current sources respectively connected to common emitters of the second pairs of emitter-coupled differential transistors of the first and second basic gates;

a fifth pair of emitter-coupled differential transistors, collectors of which are respectively connected to common emitters of the third pairs of emitter-coupled differential transistors of the first and second basic gates; and a fourth current source connected to a common emitter of the fifth pair of emitter-coupled differential transistor, wherein a clock signal is input to bases of the fourth and fifth pairs of emitter-coupled differential transistors, data is input to the first pair of emitter coupled differential transistors of the first basic gate, and an output signal is obtained from the first and second emitter followers of the second basic gate.

* * * * *